United States Patent
Cauwenberghs (10) Patent No.: US 9,599,450 B2
(45) Date of Patent: Mar. 21, 2017

(54) APPARATUS FOR MONITORING OF BRUSHES, IN PARTICULAR SLIPRING OR COMMUTATOR BRUSHES, ON ELECTRICAL MACHINES

(75) Inventor: Lieven Marie Karel Cauwenberghs, Mol (BE)

(73) Assignee: Esdaco bvba, Mol (BE)

( * ) Notice: Subject to any disclaimer, the term of this patent is extended or adjusted under 35 U.S.C. 154(b) by 563 days.

(21) Appl. No.: 14/004,193

(22) PCT Filed: Mar. 12, 2012

(86) PCT No.: PCT/EP2012/054253
§ 371 (c)(1),
(2), (4) Date: Sep. 10, 2013

(87) PCT Pub. No.: WO2012/123402
PCT Pub. Date: Sep. 20, 2012

(65) Prior Publication Data
US 2014/0009142 A1    Jan. 9, 2014

Related U.S. Application Data

(60) Provisional application No. 61/451,801, filed on Mar. 11, 2011.

(30) Foreign Application Priority Data

Mar. 11, 2011   (GB) .................... 1104155.5

(51) Int. Cl.
*G01R 27/02*   (2006.01)
*G01B 7/14*   (2006.01)
(Continued)

(52) U.S. Cl.
CPC .............. *G01B 7/14* (2013.01); *H01R 39/58* (2013.01); *H02K 11/20* (2016.01); *G01R 31/343* (2013.01); *H02K 5/14* (2013.01)

(58) Field of Classification Search
CPC ........ G01B 7/14; H01R 39/58; H02K 11/001; G01R 31/343
(Continued)

(56) References Cited

U.S. PATENT DOCUMENTS 7,280,219 B1    10/2007  Discenzo
2004/0178763 A1*  9/2004  Kuwano .................. H02P 8/14
                                                              318/685
(Continued)

FOREIGN PATENT DOCUMENTS

DE    4003669 A1    8/1990
DE    10257623 A1   7/2004
(Continued)

OTHER PUBLICATIONS

International Search Report dated Jun. 8, 2012 pertaining to International Application No. PCT/EP2012/054253.

*Primary Examiner* — Melissa Koval
*Assistant Examiner* — Courtney McDonnough
(74) *Attorney, Agent, or Firm* — Dinsmore & Shohl LLP (57) ABSTRACT

An apparatus is disclosed for monitoring brushes, such as slipring or commutator brushes, on electrical machines. At least one electronic sensor is configured to be arranged in or on a brush apparatus of an electrical machine. This sensor is measuring the brush position at high speed and high resolution, and characterized in that it receives a brush position signal from the brushes in a contact-less fashion. Data is collected by a central unit which sends the data to a server computer. Client computers can consult data, and real time monitor the status of the machine.

8 Claims, 3 Drawing Sheets

(51) Int. Cl.
*H01R 39/58* (2006.01)
*G01R 31/34* (2006.01)
*H02K 5/14* (2006.01)

(58) Field of Classification Search
USPC .......................................... 324/629, 207.11
See application file for complete search history.

(56) References Cited

U.S. PATENT DOCUMENTS

| 2009/0153089 A1* | 6/2009 | Hobelsberger | H01R 39/58 318/490 |
| 2009/0206695 A1* | 8/2009 | Cacal | H01R 39/58 310/239 |

FOREIGN PATENT DOCUMENTS

| DE | EP 1801938 A2 * | 6/2007 | ............. H01R 39/58 |
| EP | 1271716 A1 | 1/2003 | |
| EP | 1801938 A2 | 6/2007 | |

* cited by examiner

APPARATUS FOR MONITORING OF BRUSHES, IN PARTICULAR SLIPRING OR COMMUTATOR BRUSHES, ON ELECTRICAL MACHINES

FIELD OF THE INVENTION

An apparatus for monitoring of brushes is disclosed, such as slipring or commutator brushes, on electrical machines such as generators and motors.

BACKGROUND OF THE INVENTION

A purpose of a brush in an electrical device is to pass electrical current from a stationary contact to a moving contact surface, or vice versa. Brushes and brush holders may be used in electrical devices such as electrical generators, electrical motors, and/or slip ring assemblies. Brushes in many electrical devices are blocks or other structures made of conductive material, such as graphite, carbon graphite, electrographite, metal graphite, or the like, that are adapted for contact with a conductive surface or surfaces to pass electrical current.

In some designs, a brush box type brush holder, or other type of brush holder, may be used to support a brush in contact with a moving contact surface of an electrical device during operation. The brush and brush box may be designed such that the brush can slide within the brush box to provide for continuing contact between the brush and the moving contact surface contacted by the brush. During operation an anomalous and/or threshold condition may occur, which may be indicative that one or more components of the electrical device may need to be replaced, one or more components of the electrical device may require inspection or attention, and/or maintenance may need to be performed. It would be advantageous to monitor one or more components of an electrical device in order to observe the occurrence of an anomalous and/or threshold condition.

For smooth operation of an electrical machine with brushes such as these, it is desirable to monitor the brushes continuously when in operation, in particular to measure not only the brush wear, but also other parameters of the electrical power train, such as rotation speed, temperature, out-of-roundness, estimated brush life, slip ring behavior, and the like. Existing systems available on the market for remote monitoring, monitor the brush wear only and include a micro switch, optical switch (see for example GB2172445), a magnetic reed switch, see for example GB2092390, SU860187, and US2009/0206695 all comprising a magnetic reed switch at the perimeter and base of the brush holder that in cooperation with a magnetic material inside the brush will generate a signal when the brush is almost worn. Other systems are based on a wire inside the brush that makes contact at the end of life of the brush. Rather than indicating only a good or bad condition of a device part like the wear of a brush or slip ring, it is also desirable to predict a possible failure or defect before any real damage is done, based on the measurement results. Examples are sudden increased brush wear, a change in slip ring out-of-roundness, temperature rise of brush box, los of contact of the brushes with the slip ring, changes in rotation speed, changes in currents trough the brushes, etc. Wear of the slip ring can normally only be detected with measurements done during maintenance, which requires stopping and making the machine safe. Wear of the slip ring will also lead to increased wear of the brush. This can cause a lot of conductive dust (carbon) which holds risks for short circuits or other problems.

The measurement data should be preferable collected on a central server, for example on internet, such that the owner or technician of the device can follow from anywhere the status in real time and alerts can be send using modern communication techniques like e-mail, SMS etc. Also history data should be preferable available to compare measurement data. It is accordingly an object of the present invention to enable a continuous and remote monitoring of the overall performance of an electrical power train (electrical generator/electrical motor).

SUMMARY OF THE INVENTION

An apparatus for monitoring a brush and slip ring of an electrical machine, comprising: one or more electronic sensors, hereinafter also referred to as positioning sensors, configured to be arranged on one or more brush apparatus of an electrical machine which send their measurement data via a cable or wireless to a nearby central unit.

The sensors are mounted on the brush holder or any possible mounting point and receive a brush position signal from the brushes in a contact-less fashion by means of a small part mounted inside the brushes, over the complete traveling distance of the brush in the brush holder, and thus enabling a continuous monitoring of the position of the brush within the brush holder. Such a part can be a magnet or small piece of electronics that interacts with the receiving sensor, by means of a magnetic field or inductive technology.

There is preferable one central unit per machine. The central unit will send the collected sensor data to a central computer, which can be for example an internet server or a server on a local network. Client computers on the internet or local network have access to the measurement data to follow-up in real time, compare history data, check alarm conditions etc.

The system measures more than just brush wear as a simple brush length limit value to determine if the brush needs to be replaced. When measuring the position of the brushes at a high speed with high resolution at µm level, the rotation speed of the slip ring, and the out-of-roundness (like eccentricity or ovality) of the slip ring can also be analyzed. An example of out-of-roundness value determined using the sensors of the present invention could be as low as about 40 µm.

Each deformation of a slip ring on rotating electrical machines will lead to problems during operation. These difficulties sometimes appear suddenly and in various ways. Examples are brush sparking, high brush wear, noise, damage of springs of brush holders.

Another example of analysis is the brush wear evolution in time. A sudden increase in brush wear can indicate the presence of a burn mark on the slip ring.

From the high-speed sensor data, temperature etc. analysis can be performed to predict and prevent problems like mentioned above, including an accurate estimation of brush life and so prevent costs and machine down time.

BRIEF DESCRIPTION OF THE DRAWING

Further advantages and application options of the present disclosure will become evident from the following description in conjunction with the exemplary embodiments which are illustrated in the drawings.

The expressions and associated reference symbols shown in the list of reference symbols provided further below are used in the description, in the claims, in the abstract and in the drawings.

DETAILED DESCRIPTION OF THE INVENTION

An apparatus is disclosed for monitoring of brushes such as slip ring or commutator brushes, on electrical machines which can allow continuous remote monitoring of a brush, i.e. continuous monitoring of its position.

In a first objective the present invention provides an apparatus for monitoring a brush (2) of an electrical machine, comprising;

at least one electronic positioning sensor (3) configured to be arranged on a brush holder assembly of an electrical machine, wherein said electronic sensor measures brush position at high speed and high resolution, and is characterized in that it continuously receives a brush position signal from the brushes (2) in a contact-less fashion by means a position sensor interacting part (4); and means (5) to transmit the position signal to a processing unit.

Given the contact-less operation of the present positioning sensor, over the complete traveling distance of the brush in the brush holder, the present apparatus is different from the art know methods of monitoring brushes in electrical apparatus, and allows a continuously high speed and high resolution monitoring of the position of the brushes. Not only does the positioning sensor have a broad operational range covering the typical wear, and travel distance of the brushes in the brush holder of between and about 1.0 cm to about 5.0 cm, but within said range the positioning sensor of the present invention is extremely sensitive and allows to detect real-time changes in the position of the brush at µm level. The high sensitivity of the apparatus of the present invention is due to the rate at which the position of the brush is being sampled. The sample rate at which the brush position is sampled will normally be minimum 1000 Hz and maximum 10000 Hz, also depending on machine rotation speed, with a typical resolution of one to a few µm.

In enabling a contact-less position measurement, the one or more brushes of the apparatus for monitoring a brush (2) of an electrical machine, comprise a position sensor interacting part (4), preferably mounted inside the brush (2). Evidently, in enabling the aforementioned contact-less measurement said position sensor interacting part is distally located from the surface of the brush (2) in contact with the slip ring (7) of the electrical apparatus. In one embodiment the position sensor interacting part (4) is mounted inside the brush close to the surface of the brush (2) opposite from the surface of the brush in contact with the slip ring (7), such as for example up to a depth of about 1.5 cm from the surface of the brush (2) opposite from the surface of the brush in contact with the slip ring (7).

In an alternative embodiment of the present invention, and in particular to allow and determine the rotation speed of the slip ring, the apparatus for monitoring a brush (2) of an electrical machine, further comprises means to synchronize the determination of the brush position signal, with the rotation of the slip ring. Said means could for example consist of a pulse (signal) generated by the shaft of the motor at each revolution, and transmitted, either directly to the positioning sensor or indirectly through the processing unit.

The electronics on the positioning sensor can sense the position of the position sensor interacting part, such as for example using a magnetic field or an inductive field. Consequently, in a particular embodiment of the present invention the position sensor interacting part is selected from the group consisting of a magnet or an inductive reactor. In said latter case the sensor electronics transmit an inductive signal, which is attenuated by the target, alternatively the electronics on the positioning sensor includes a plurality of HAL-sensors; in particular 2, 3, 4, 5, 6, 7, 8, 9 or 10; more in particular at least three HAL-sensors, that in combination allow the positioning sensor the sense the position of the position sensor interacting part over the complete traveling distance of the brush in the brush holder.

In a further embodiment of the present invention, the electronics on the position sensor may further include temperature-measuring means, allowing a simultaneous and continuous determination of the brush temperature and the brush position. When further combined with the means to synchronize the determination of the brush position signal, with the rotation of the slip ring, the sensor of the present invention not only allows a continuous monitoring of the position of the brushes, but also a continuous monitoring of the temperature and the rotation speed of the slip ring.

As already explained hereinbefore, monitoring of the aforementioned parameters of the electrical apparatus when in operation allows one to predict when an inspection or attention, and/or maintenance may need to be performed, resulting in a significant reduction in down-time of the apparatus.

In order to enable an evaluation of the positioning signal determined using the positioning sensor as described herein, the apparatus further comprises means to transmit the position signal to a processing unit. In some embodiments the processing unit, hereinafter also referred to as the central unit may be located in the same location (e.g., same room, building, facility, etc.) as the electrical machine, or the processing unit may be located at a location remote from the electrical machine (e.g., different building, facility, city, county, state, country, etc.). Accordingly, in a first embodiment the apparatus and in particular the positioning sensor, may be wired to the processing unit, and said means to transmit the position signal to a processing unit include a data communication network enabling wired transmission of the positioning signal to a processing unit. In an alternative embodiment the apparatus and in particular the positioning sensor, is remotely and wirelessly connected to the processing unit, and said means to transmit the position signal to a processing unit include a data communication network enabling wireless transmission of the positioning signal to a processing unit. Thus, in a particular embodiment the processing unit may be in a centralized location networked to the apparatus for monitoring a brush of an electrical machine, and acquiring multiple signals from multiple positioning sensors simultaneously, sequentially, periodically, intermittently, selectively and/or manually, for example.

The processing unit, which may be a personal computer or other computer, a server, a controller, a tuner, a converter, or other device, or combinations and/or multiples thereof, receives the signal(s) sent from the positioning sensors. The processing unit may then display the data and/or automatically, manually, and/or selectively evaluate the data using an algorithm, or other evaluation technique, to analyze a parameter, such as the position of the brush, RPM (rotation speed), brush wear, temperature, out-of-roundness, estimated brush life, etc. . . . , in order to determine a condition of a component of the electrical device or the brush, such as an anomalous and/or threshold condition of a brush, for example, or others. In some embodiments, the processing unit may include a monitor which may be used to display the data received. The processing unit may also be configured to inform a user of a condition of the electrical device, such as the state of the brush, and/or alert, notify, schedule and/or advise maintenance, part delivery, on site inspection, and/or other task, shut down the system, and/or otherwise perform a consultative and/or responsive function in view of the determined condition of the brush or other component of the electrical device.

In an even further embodiment of the present invention the apparatus for monitoring a brush of an electrical machine, further includes a temperature sensor. In a particular embodiment said temperature sensor is present on and optionally integrated within the same electronic positioning sensor (3) configured to be arranged on a brush holder assembly of an electrical machine. Said temperature sensor includes any art known circuit that enable to convert a change in temperature in an electrical signal, such as for example thermistors.

Figure 1:
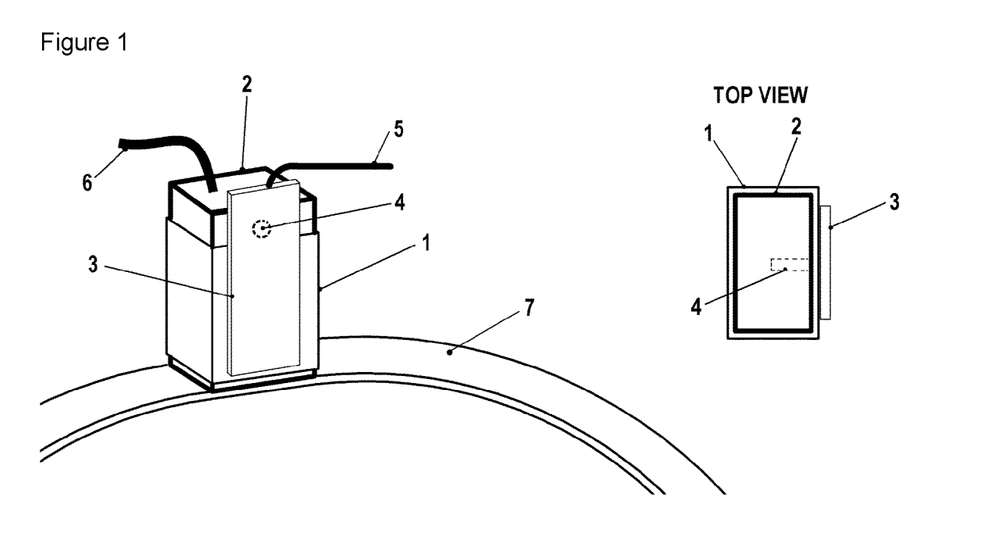
FIG. 1 shows a first basic sensor assembly on a brush holder for monitoring of a slipring brush according to the disclosure. This sensor will be connected to a central unit.

In a second objective, and with reference to FIG. 1, the present invention provides a brush holder assembly of an electrical machine, characterized in that it comprises an electronic positioning sensor (3) arranged on the brush holder (1) of said brush holder assembly and a position sensor interacting part (4), that is sensed by the electronic positioning sensor in a contact-less fashion, characterized in that the electronic positioning sensor (3) allows a continuous monitoring of the position of the brush within the holder. In that it is capable of determining the position of the brush over the complete traveling distance of the brush in the brush holder.

In one embodiment the position sensor interacting part (4) is mounted on the surface of the brush (2) opposite from the surface of the brush in contact with the slip ring (7). In an alternative embodiment the position sensor interacting part (4) is mounted inside the brush; particularly at a depth of up to about 1.5 cm from the surface of the brush (2) opposite from the surface of the brush in contact with the slip ring (7).

The electronics on the positioning sensor can sense the position of the position sensor interacting part, such as for example using a magnetic field or an inductive field. Consequently, in a particular embodiment of the brush holder assembly the position sensor interacting part is selected from the group consisting of a magnet or an inductive reactor. In said latter case the sensor electronics transmit an inductive signal, which is attenuated by the target.

In an even further embodiment the brush holder assembly according to present invention further includes means (5) to transmit the position signal to a processing unit. In analogy with the apparatus mentioned hereinbefore, said means to transmit the positioning signal to the processing unit include wired transmission, wireless transmission and a combination thereof, such as a Local Area Network (LAN), for example a wired LAN or a wireless LAN, or the Internet, connecting multiple brush holder assemblies and/or multiple processing units. Accordingly, in a particular embodiment of the brush holder assembly, the means to transmit the position signal to a processing unit include a data communication network enabling wired or wireless transmission of the positioning signal to a processing unit.

In a final objective, the present invention provides an electrical machine comprising an apparatus and/or a brush holder assembly as described herein.

The detailed description and the drawings, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

Now referring to FIG. 1, in an exemplary embodiment, an electronic sensor is configured to be arranged on the brush apparatus of an electrical machine. The setup contains the following parts. The brush holder (1) can be seen as a simple metal box, holding the carbon brush (2). The carbon brush (2) slides down in this box to make contact with the slip ring (7). The brush is pushed down, usually by a mechanism with a spring (not shown in figure). The electrical current flows from the brush cable (6) via the carbon brush (2) to the rotating slip ring (7). This is a setup found in many electrical machines. The number of brushes per slip ring can vary and thus also the numbers of sensors used per slip ring.

The sensor consists of two parts. The electronics board which is mounted on the outside of the brush holder and secondly an interacting part, mounted inside the brush. The electronics on the board can sense the position of the interacting part and so forms a contact-less position sensor. As is evident from FIG. 1, the electronics board (the positioning sensor) covers the full traveling distance of the brush in the brush holder and with the position sensor interacting part (4) being mounted close to or at the brush surface (2) opposite from the surface of the brush in contact with the slip ring (7), it enables a continuous measurement of the position of the brush in its traveling through the brush holder.

The interacting part (4) can be a simple magnet, and the position can be determined by measuring the magnetic field from the moving magnet, such as for example using a plurality of HAL-sensors. A second implementation can be by use of an inductive reactor (also called 'target'). In this case the sensor electronics transmits an inductive signal, which is attenuated by the target. The level of attenuation can be used to determine the position. The sensor is powered via the cable and thus via the central unit.

The central unit is the master of the system and is communicating with all sensors on the different brushes. The system is build with minimum one sensor and a maximum that is only limited by the number of brushes in the machine.

Figure 2:
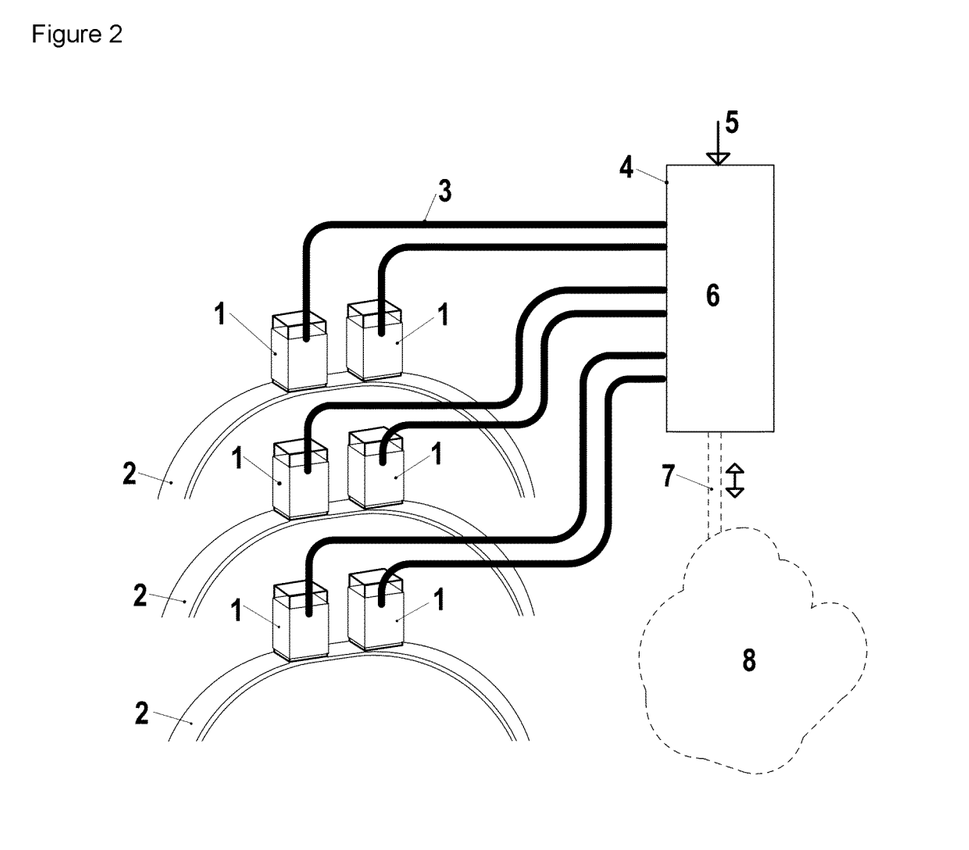
FIG. 2 shows a schematic setup of several slip rings and brushes with sensors connected to a central unit. The central unit is connected to the internet or a network.

FIG. 2 shows a system setup with a plurality of sensors. Each slip ring (2) can have more than one brush with sensor (1) and a machine will typically have more than one slip ring. Each sensor is wired (3) to the central unit (4). The central unit (4) is collecting all the data and sends the data to a central server via the internet (8) or on a local network (8). The connection can be made via a standard ethernet data cable (7), via satellite or any modern communication technique. Where the actual analysis is performed is not clearly defined, part of the analysis will be done in the central unit, and other analysis will be performed on the server.

Figure 3:
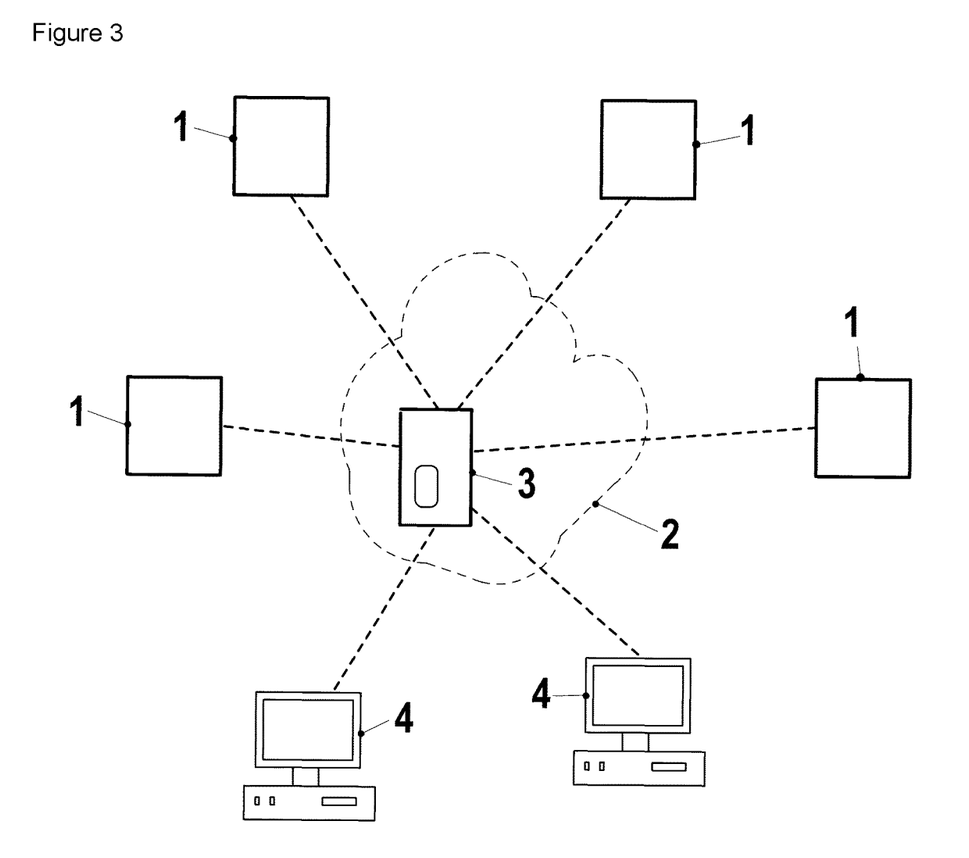
FIG. 3 shows a schematic setup of a network of several remote monitor locations, connected via the internet or local network to a server and clients accessing the data.

FIG. 3 shows a complete world wide setup. Each remote location (1) anywhere in the world can be connected to a central server (3) via internet or local network (2). Machine owners or maintenance personnel can consult the data via a client (4). The client (4) can be a custom software installed on their computer, or a web page consulting the database content. The server (3) is also capable of automatically generating alarms using modern communication techniques like for example e-mail and SMS.

The client will show real time data and history data, so that comparisons can be made and evolution of the machine can be consulted. A few examples of life data are: RPM (rotation speed), brush wear, temperature, out-of-roundness, estimated brush life, etc. Comparing different machines with each other by consulting database data is also a valuable option.

REFERENCE SYMBOLS FIG. 1

1 Brush holder
2 Brush
3 Electronic sensor (PART 1: the electronics)
4 Electronic sensor (PART 2: the interacting part)
5 Electronic sensor wiring
6 Brush cable
7 Slip ring

REFERENCE SYMBOLS FIG. 2

1 Brush holders with sensor electronics
2 Slip rings
3 Electronic sensor wiring
4 Central unit housing
5 Power to central unit
6 Central unit
7 Communication to internet or local network
8 Internet or network

REFERENCE SYMBOLS FIG. 3

1 Remote location (machine to monitor)
2 Internet or network
3 Central computer (server)
4 Client computers

The invention claimed is:

1. An apparatus for monitoring a brush of an electrical machine, comprising:
   at least one electronic positioning sensor configured to be arranged on a brush holder assembly of an electrical machine, wherein said electronic positioning sensor is configured to sample the brush position at high speed and high resolution, wherein the high speed is a frequency range of from 1000 Hz to 10,000 Hz and the high resolution is a μm level of from 1 μm to 40 μm, wherein the electronic positioning sensor continuously receives a brush position signal from the brushes in a contact-less fashion by a position sensor interacting part, and wherein the electronic positioning sensor covers the full traveling distance of the brush in the brush holder; and
   means to transmit the position signal to a processing unit; and further comprising means to synchronize the determination of the brush position signal with the rotation of the slip ring.

2. An apparatus according to claim 1, wherein the brush comprises a position sensor interacting part.

3. An apparatus according to claim 2, wherein the position sensor interacting part is mounted inside the brush.

4. An apparatus according to claim 2, wherein the electronics on the positioning sensor can sense the position of the position sensor interacting part.

5. An apparatus according to claim 2, wherein the position sensor interacting part is selected from the group consisting of a magnet and an inductive reactor.

6. An apparatus according to claim 1, wherein the means to transmit the position signal to a processing unit include a data communication network enabling wired or wireless transmission of the positioning signal to a processing unit.

7. An apparatus according to claim 1, wherein the electronic positioning sensor further includes a temperature sensor.

8. An electrical machine comprising an apparatus according to claim 1.

* * * * *

UNITED STATES PATENT AND TRADEMARK OFFICE
CERTIFICATE OF CORRECTION

PATENT NO. : 9,599,450 B2
APPLICATION NO. : 14/004193
DATED : March 21, 2017
INVENTOR(S) : Lieven Marie Karel Cauwenberghs It is certified that error appears in the above-identified patent and that said Letters Patent is hereby corrected as shown below:

In the Specification

Column 1, Line 62:
"ring out-of-roundness, temperature rise of brush box, los of"
Should read:
--ring out-of-roundness, temperature rise of brush box, loss of--;

Column 1, Line 64:
"speed, changes in currents trough the brushes, etc. Wear of"
Should read:
--speed, changes in currents through the brushes, etc. Wear of--;

Column 2, Line 4:
"The measurement data should be preferable collected on"
Should read:
--The measurement data should be preferably collected on--;

Column 2, Line 7:
"status in real time and alerts can be send using modern"
Should read:
--status in real time and alerts can be sent using modern--;

Column 2, Line 9:
"tory data should be preferable available to compare mea-"
Should read:
--tory data should be preferably available to compare mea- --;

Signed and Sealed this
Twenty-first Day of November, 2017

Joseph Matal
*Performing the Functions and Duties of the
Under Secretary of Commerce for Intellectual Property and
Director of the United States Patent and Trademark Office*

CERTIFICATE OF CORRECTION (continued)

Column 2, Line 33:
"There is preferable one central unit per machine. The"
Should read:
--There is preferably one central unit per machine. The--;

Column 3, Line 39:
"art know methods of monitoring brushes in electrical appa-"
Should read:
--art known methods of monitoring brushes in electrical appa- --;

Column 4, Line 21:
"allow the positioning sensor the sense the position of the"
Should read:
--allow the positioning sensor to sense the position of the--; and Column 6, Line 50:
"system is build with minimum one sensor and a maximum"
Should read:
--system is built with minimum one sensor and a maximum--.